United States Patent
Necoechea et al.

(12)

(10) Patent No.: US 7,512,857 B1
(45) Date of Patent: Mar. 31, 2009

(54) PATTERN CORRECTION CIRCUIT

(75) Inventors: Warren Necoechea, Scotts Valley, CA (US); Timothy Alton, Gilroy, CA (US); Mark Deome, San Jose, CA (US); Henk Zantman, Livermore, CA (US)

(73) Assignee: LTX Corporation, Westwood, MA (US)

( * ) Notice: Subject to any disclaimer, the term of this patent is extended or adjusted under 35 U.S.C. 154(b) by 550 days.

(21) Appl. No.: 11/193,873

(22) Filed: Jul. 29, 2005

(51) Int. Cl.
*G06F 11/00* (2006.01)

(52) U.S. Cl. .................................... 714/738

(58) Field of Classification Search .......... None
See application file for complete search history.

(56) References Cited

U.S. PATENT DOCUMENTS

| | | | | |
|---|---|---|---|---|
| 4,377,862 A | * | 3/1983 | Koford et al. | 714/748 |
| 4,887,269 A | * | 12/1989 | Cominetti et al. | 714/798 |
| 6,563,789 B1 | * | 5/2003 | Rasanen | 370/230 |

* cited by examiner

*Primary Examiner*—Christine T Tu
(74) *Attorney, Agent, or Firm*—Blakely, Sokoloff, Taylor & Zafman LLP

(57) ABSTRACT

A method is described for facilitating use of a first pattern utilizing XOR data formatting in an electronic tester. The method includes dividing the first pattern into at least a first group and a second group, the tester to successively execute the first group and the second group. The method further includes assuming an entry state for each group is one of two binary conditions and inverting programmed commands for the second group if an ending state of the first group is not equal to the assumed entry state.

11 Claims, 6 Drawing Sheets

PATTERN CORRECTION CIRCUIT

FIELD

Embodiments of the present invention pertain to the field of automatic electrical test systems. More particularly, embodiments of the present invention relate to using patterns in automatic electrical test systems.

BACKGROUND

Integrated circuit devices are typically tested after fabrication to ensure device performance according to functional specifications. Typically, an automatic electrical test system is programmed to provide an integrated circuit device with a simulated operating environment. Very-large-scale-integration (VLSI) devices require an automatic electrical test system capable of processing a large number of high-speed input/output pins.

In a typical automatic electrical test system, an interface between a timing generator and the driving pin electronics of the system must accommodate the data rate of the device under test (DUT). High DUT data rates necessitate high IO bandwidth between the timing generator and the driving pin electronics, which can be very costly to implement. To reduce the IO bandwidth between the timing generator and the driving pin electronics, while accommodating the high DUT data rate, typically two channels, each having half the required data rate, are XORed together.

For testing, circuitry in the electrical test system applies a test pattern utilizing XOR data formatting to the DUT and receives outputs from the DUT in response to the test patterns. Typically, the entire pattern is compiled and loaded onto the Deep Pattern Memory (DPM) of the tester to be executed by the tester and converted from a representation of driven ONEs and ZEROs to a representation which drives a change from one signal state of the DUT to another signal state. A change from one signal state to another is called a transition. Because a state in the pattern depends on the previous state, typically any change to the pattern ripples through the entire pattern sequence. To avoid the ripples, a corrected pattern from the location of the change to the end of the pattern must be recompiled and loaded. This is prohibitively time consuming for all but short patterns.

Additionally, complete patterns are concatenated from many short pattern segments. Pattern segments can be reused and will behave differently depending on whether the entry state to the segment is a ONE or a ZERO.

SUMMARY

A method is discussed for facilitating use of a first pattern utilizing XOR data formatting in an electronic tester. The method includes dividing the first pattern into at least a first group and a second group, the tester to successively execute the first group and the second group. The method further includes assuming an entry state for each group is one of two binary conditions and inverting programmed commands for the second group if an ending state of the first group is not equal to the assumed entry state.

Other features and advantages of embodiments of the invention will be apparent from the accompanying figures and from the detailed description which follows below.

BRIEF DESCRIPTION OF THE DRAWINGS

One or more embodiments of the present invention are illustrated by way of example and not limitation in the figures of the accompanying drawings, in which like references indicate similar elements, and in which.

DETAILED DESCRIPTION

A method is described for facilitating use of a first pattern utilizing XOR data formatting in an electronic tester. As described further below, the method includes dividing the first pattern into at least a first group and a second group with the tester successively executing the first group and the second group. The method further includes assuming an entry state for each group is one of two binary conditions and inverting programmed commands for the second group if an ending state of the first group is not equal to the assumed entry state. The method prevents changes in a programmed vector from rippling through the entire pattern sequence and enables a pattern having a specific beginning state to follow a pattern with an ending state that is different from the specific beginning state. A method and apparatus for calculating XOR marker definitions from the desired output pattern data are also described.

Figure 1:
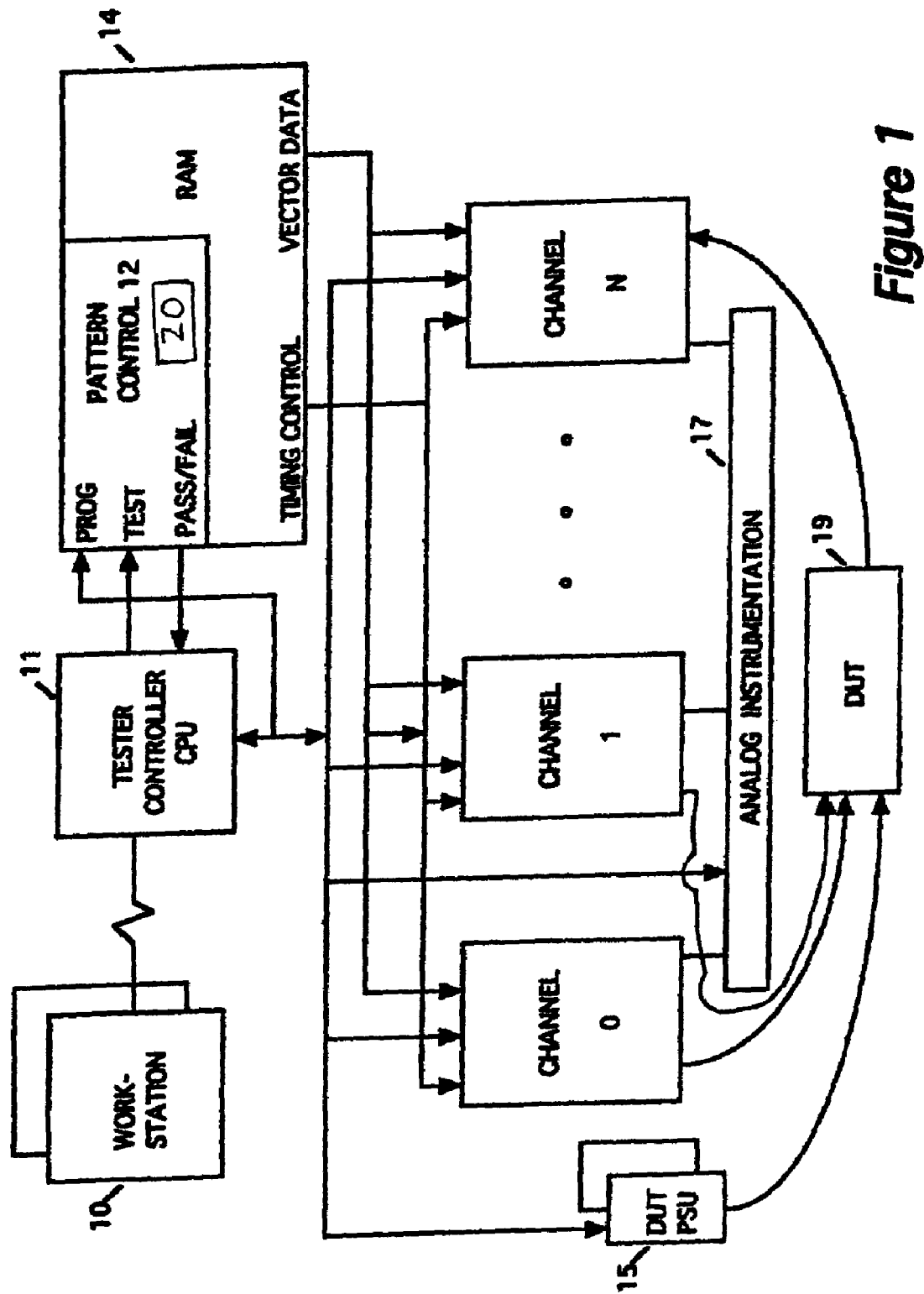
FIG. 1 is a block diagram illustrating the major elements of an automatic electrical test system.

FIG. 1 is a block diagram illustrating the major elements of an automatic electrical test system, called a "tester" herein. The diagram shows an example DUT 19 coupled for testing. A workstation 10 is coupled for communication over a network to a tester controller CPU 11. The workstation 10 may also be combined with CPU 11. The workstation 10 enables a user to develop and execute test programs and analyze results. The tester controller CPU 11 is a computer resource for managing test program loading and execution, as well as results extraction, system calibration, and diagnostics. The CPU 11 loads test programs over a data bus 116.

A pattern control block 12 performs real-time test program execution, and provides the timing and logic state for stimulus source and expected response data. One embodiment of the invention is implemented in location 20 inside the pattern control block 12. A tester vector RAM 14 stores vector data and timing control, generally for each channel. The vector data portion of the tester vector RAM 14 stores the stimulus and expected response values to be applied to the device under test on a cycle by cycle basis. The timing control portion of the tester vector RAM 14 stores an entry per vector that determines the timing of the formatted stimulus to the device under test, as well as the strobe timing and fail masking of the response from the DUT 19.

A DUT PSU circuit 15 provides programmable power sources for the device under test 19. An analog instrumentation circuit 17 enables precision stimulus and measurement capabilities for voltage, current, and time at the device under test 19. A set of pin channel circuits 13 (channel 0 through channel N) contain the timing generators and formatters for shaping the stimulus, and pin drivers for interfacing to the DUT 19 at programmable levels. The pin channel circuits also contain the timing generators for strobing the DUT 19 response after the response passes through programmable level comparators. In the example shown, channels 0 and 1 provide the stimulus to the DUT 19, and channel N measures the response.

Figure 2:
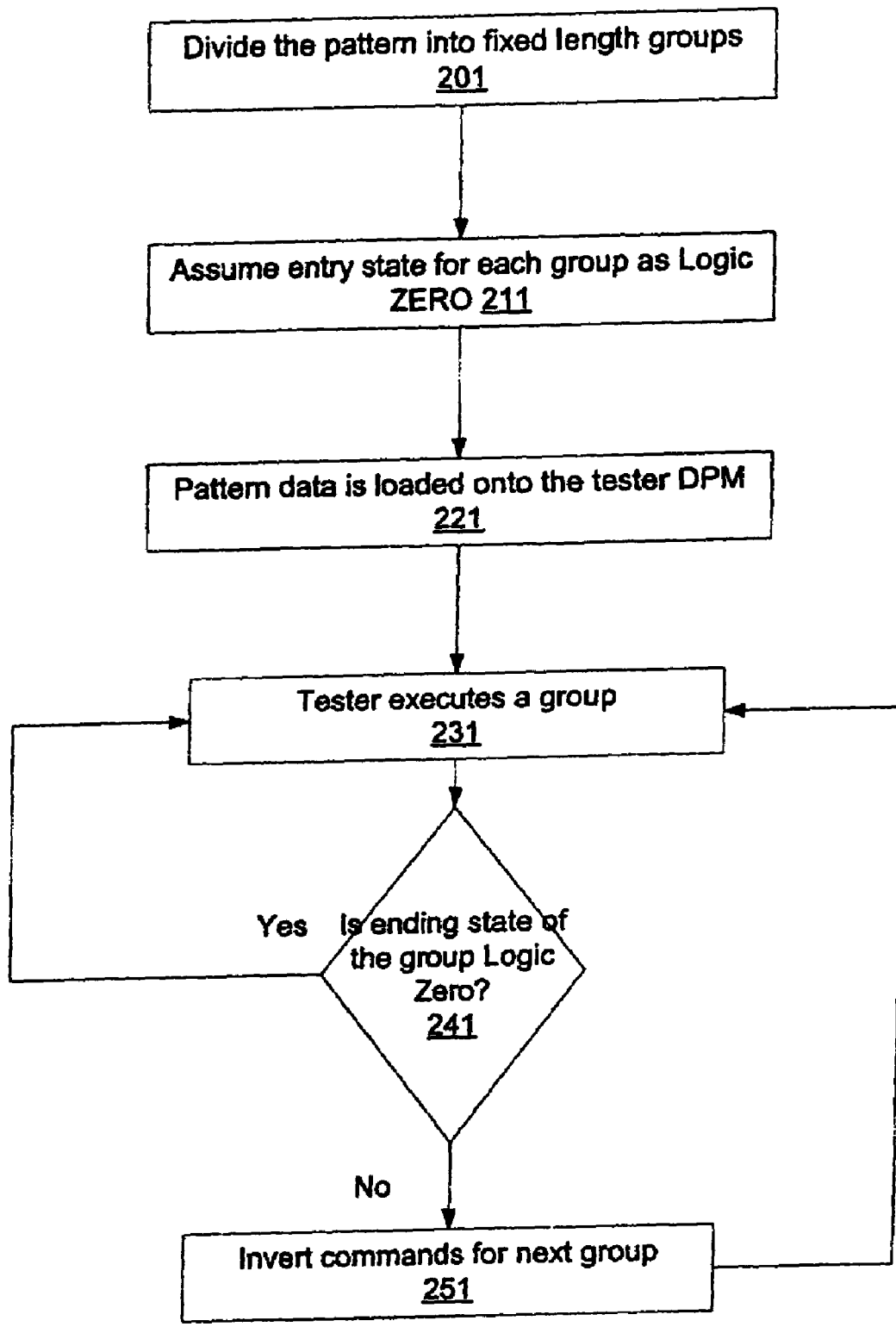
FIG. 2 is a flow diagram showing a process of performed by a tester to facilitate usage of high-speed patterns utilizing XOR formatting of data.

FIG. 2 shows an example of the overall process implemented in location 20 which may be performed by a tester to facilitate use of a high-speed pattern utilizing XOR formatting of data. The techniques introduced herein can be implemented in software, either in whole or in part. At block 201, the compiler divides the pattern into fixed length groups, called a "tester vector" herein. For one embodiment of the present invention, the groups are relatively small. Thus a pattern typically can be divided into more than a million groups.

At block 211, the compiler assumes that the entry state for each tester vector is one of a binary condition—Logic ZERO or ONE. Although the description utilizes an entry state for each tester vector as Logic ZERO, assignment of the entry state for each tester vector as Logic ONE can also be made. Accordingly, the pattern control block 12 sends commands to cause transitions with the assumption that the entry state is LO. Indeed, the programmed commands for the first group are independent of the programmed commands for the second group.

At block 221, the pattern data is loaded onto the tester DPM to be executed. At block 231, the tester executes this pattern and monitors the ending state of each tester vector. At block 241, if the ending state of a tester vector is not Logic ZERO, the pattern control block 12 bit-wise inverts the transition commands for the vector succeeding the vector having a Logic ONE ending state.

Figure 3:
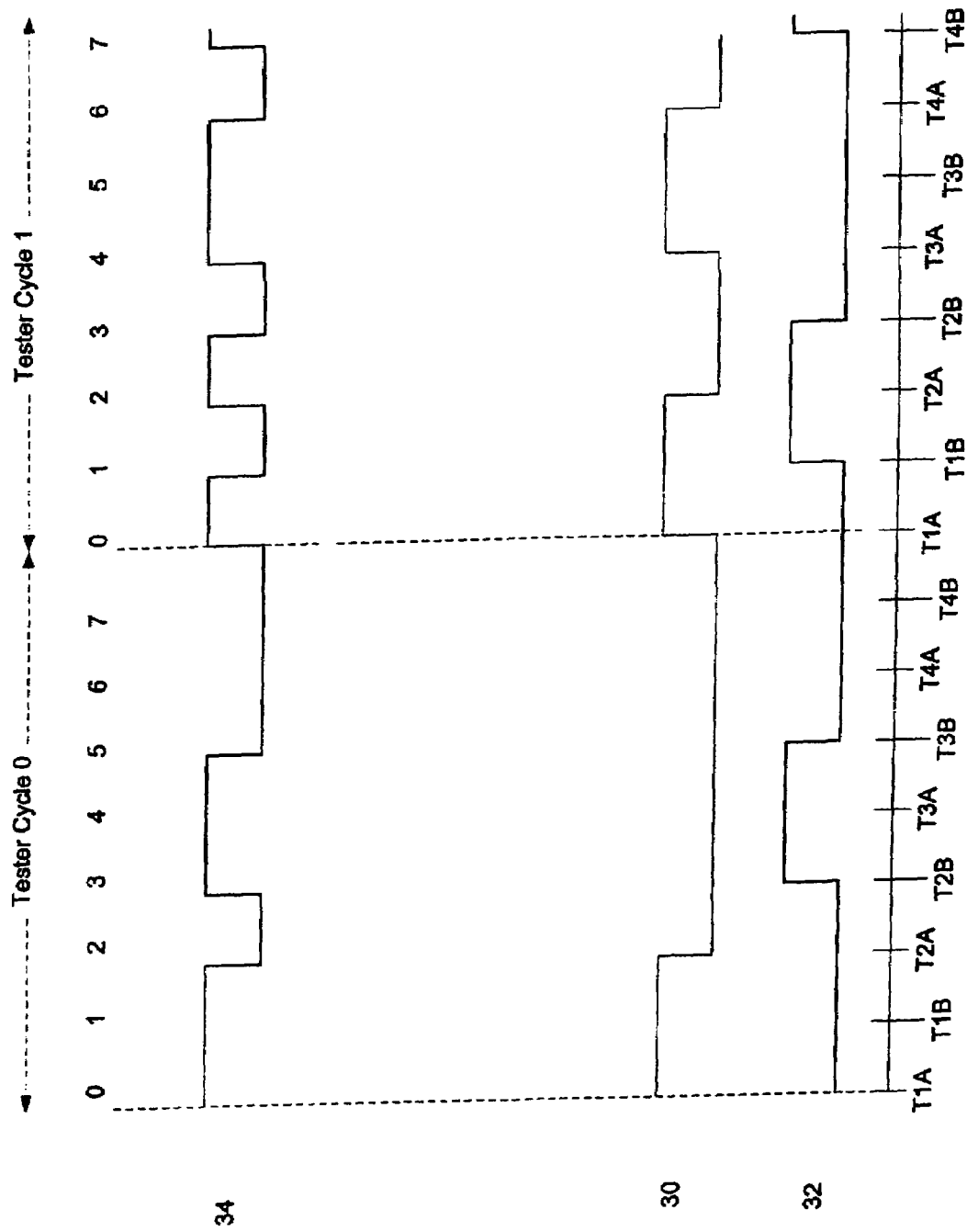
FIG. 3 illustrates tester waveforms with an ending state of Logic ZERO.
Figure 4:
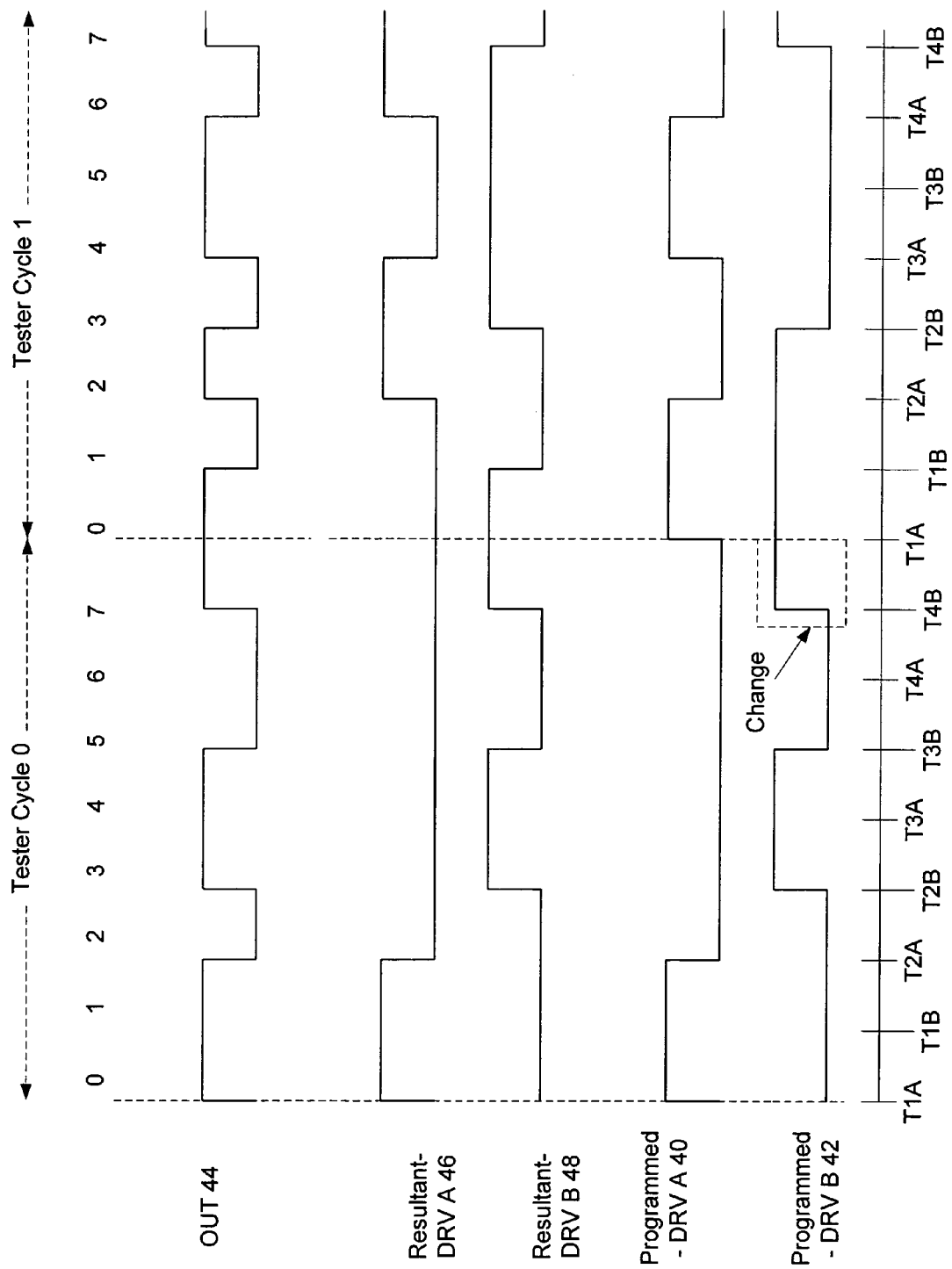
FIG. 4 illustrates tester waveforms without an ending state of Logic ZERO.

FIGS. 3 and 4 illustrate the inversion being applied to programmed waveforms. FIG. 3 illustrates tester waveforms 30 and 32 with an ending state of Logic ZERO. The tester waveforms 30 and 32 are XORed together to produce an output waveform 34, which is then applied to DUT 19. FIG. 4 illustrates tester waveforms 40 and 42, where a change causes the ending state to change. FIGS. 3 and 4 are described below in greater detail. For one embodiment, eight events or bit cells are generated per tester cycle. Each bit cell is generated by a marker. Accordingly, four events are generated from Channel 0 and four from Channel 1. Channel 0 generates all the events (T1A, T2A, T3A, T4A) for even numbered bit cells (0, 2, 4, 6) respectively. Channel 1 generates all the events (T1B, T2B, T3B, T4B) for the odd numbered bit cells (1, 3, 5, 7) respectively.

As shown in FIG. 3, waveform 30 is the programmed waveform driven by Channel 0 and waveform 32 is the programmed waveform driven by Channel 1. The output waveform 34 of programmed waveforms 30 and 32 is obtained by performing an XOR operation on programmed waveform 30 and programmed waveform 32. Thus, if waveforms 30 and 32 have the same value (e.g., both are HI or both are LO), output waveform 34 is LO. If waveforms 30 and 32 have different values (e.g., waveform 30 is HI and waveform 32 is LO), output waveform 34 is HI, as shown in the table below:

TABLE 1

| Event Marker | Vector, Bit | 30 | 32 | 34 |
|---|---|---|---|---|
| T1A-V0 | 0, 0 | HI | LO | HI |
| T1B-V0 | 0, 1 | HI | LO | HI |
| T2A-V0 | 0, 2 | LO | LO | LO |
| T2B-V0 | 0, 3 | LO | HI | HI |
| T3A-V0 | 0, 4 | LO | HI | HI |

TABLE 1-continued

| Event Marker | Vector, Bit | 30 | 32 | 34 |
|---|---|---|---|---|
| T3B-V0 | 0, 5 | LO | LO | LO |
| T4A-V0 | 0, 6 | LO | LO | LO |
| T4B-V0 | 0, 7 | LO | LO | LO |
| T1A-V1 | 1, 0 | HI | LO | HI |
| T1B-V1 | 1, 1 | HI | HI | LO |
| T2A-V1 | 1, 2 | LO | HI | HI |
| T2B-V1 | 1, 3 | LO | LO | LO |
| T3A-V1 | 1, 4 | HI | LO | HI |
| T3A-V1 | 1, 4 | HI | LO | HI |
| T4A-V1 | 1, 6 | LO | LO | LO |
| T4B-V1 | 1, 7 | LO | HI | HI |

FIG. 4 illustrates the inversion process when a change in tester waveforms 30 and 32 that results in tester waveforms 40 and 42 having a state of Logic ONE at the end of tester cycle 0. Waveform 40 is the programmed waveform driven by Channel 0 and waveform 42 is the programmed waveform driven by Channel 1. Tester waveforms 30 and 32 are the same as tester waveforms 40 and 42 with one major difference; at event T4B, waveform 42 is HIGH when waveform 32 is LO. The state of waveform 42 in bit 7 is the ending state of the tester cycle 0. Because this state is HIGH and the next tester cycle assumes a LO as the entry state for the next vector, the transitions of tester cycle 1 as programmed are inverted. The output waveform 44 is based on the inverted programmed waveforms represented in FIG. 4 as resultant waveforms 46 and 48.

Therefore, during tester cycle 1, at bit 0 (event T1A), programmed waveform 40 is inverted from HIGH to result in resultant waveform 46 which is LO. Programmed waveform 42 is not inverted at T1A in vector 1 because at the even-numbered bit event (T1A, T2A, T3A, T4A) only the waveform driven by Channel 0, which is waveform 40, can be changed. Thus, output waveform 44 is HIGH. At bit 1 (event T1B), programmed waveform 40 remains HIGH, since at the odd-numbered bit events (T1B, T2B, T3B, T4B) only the waveform driven by Channel 1, which is waveform 42, can be changed. Thus, at bit 1 (event T1B), programmed waveform 42 is inverted from HIGH to result in resultant waveform 48 which is LO. Thus, output waveform 44 is LO. The process continues to obtain output waveform 44, as shown below.

TABLE 2

| Marker | Vector, Bit | 40 | 42 | 46 | 48 | 44 |
|---|---|---|---|---|---|---|
| T1A-V0 | 0,0 | HI | LO | HI | LO | HI |
| T1B-V0 | 0,1 | HI | LO | HI | LO | HI |
| T2A-V0 | 0,2 | LO | LO | LO | LO | LO |
| T2B-V0 | 0,3 | LO | HI | LO | HI | HI |
| T3A-V0 | 0,4 | LO | HI | LO | HI | HI |
| T3B-V0 | 0,5 | LO | LO | LO | LO | LO |
| T4A-V0 | 0,6 | LO | LO | LO | LO | LO |
| T4B-V0 | 0,7 | LO | HI | LO | HI | HI |
| T1A-V1 | 1,0 | HI | HI | LO | HI | HI |
| T1B-V1 | 1,1 | HI | HI | LO | LO | LO |
| T2A-V1 | 1,2 | LO | HI | HI | LO | HI |
| T2B-V1 | 1,3 | LO | LO | HI | HI | LO |
| T3A-V1 | 1,4 | HI | LO | LO | HI | HI |
| T3B-V1 | 1,4 | HI | LO | LO | HI | HI |
| T4A-V1 | 1,6 | LO | LO | HI | HI | LO |
| T4B-V1 | 1,7 | LO | HI | HI | LO | HI |

The following table compares the output waveform 34 obtained when ending state of tester cycle 0 is LO, and output waveform 44 obtained when ending state of tester cycle 0 is HI.

TABLE 3

| Marker | Vector, Bit | Output waveform 34 | Output waveform 44 |
|---|---|---|---|
| T1A-V0 | 0, 0 | HI | HI |
| T1B-V0 | 0, 1 | HI | HI |
| T2A-V0 | 0, 2 | LO | LO |
| T2B-V0 | 0, 3 | HI | HI |
| T3A-V0 | 0, 4 | HI | HI |
| T3B-V0 | 0, 5 | LO | LO |
| T4A-V0 | 0, 6 | LO | LO |
| T4B-V0 | 0, 7 | LO | HI |
| T1A-V1 | 1, 0 | HI | HI |
| T1B-V1 | 1, 1 | LO | LO |
| T2A-V1 | 1, 2 | HI | HI |
| T2B-V1 | 1, 3 | LO | LO |
| T3A-V1 | 1, 4 | HI | HI |
| T3B-V1 | 1, 5 | HI | HI |
| T4A-V1 | 1, 6 | LO | LO |
| T4B-V1 | 1, 7 | HI | HI |

The third column in the above table represents the output waveform 34 obtained in FIG. 3. The fourth column represents the output waveform 44 obtained in FIG. 4. At event marker T4B-V0, the output waveform 34 is LO, while the output waveform 44 is HIGH. This reflects the change in the programmed waveform. In tester cycle 1, however, the output waveforms 34 and 44 are exactly the same. Thus, the change to the programmed waveforms in tester cycle 0 did not get carried through tester cycle 1. Accordingly, the method shown in FIG. 2 creates XOR patterns where changes do not ripple through the entire pattern sequence. Furthermore, any changes to the pattern data that do not change the ending state of a vector cycle also will not get carried through to the next vector cycle. Thus, a change to the vector stream does not require recompiling and reloading of pattern from the location of the change to the end of pattern.

Thus, FIGS. 3 and 4 illustrate the method of inverting commands for a vector (vector 1) when the ending state of a preceding vector (vector 0) does not match the assumed entry state. This method is advantageous in that patterns having different exit and entry states can be concatenated.

According to certain embodiments of the present invention, a method and apparatus for calculating input waveforms (e.g. input waveforms 30 and 32) is presented. Accordingly, a desired pattern is programmed and XOR marker definitions calculated from the desired pattern data. XOR marker definitions are obtained by XORing the ending state of the last vector with the state of the first bit cell of the desired pattern. The output waveform is the desired pattern. The equation for the XOR marker definitions can thus be stated as follows: $R_i = P_i$ XOR $R_{i-1}$; where the term "$R_i$" represents the beginning state of the resultant vector. The term "$R_{i-1}$" represents the ending state of the last vector, which is assumed to be LO. The term "$P_i$" represents the desired state of the first bit cell of the current vector. The term "i" represents the bit cell. Therefore, for a tester cycle, e.g. tester cycle 0, the programmed drive is XORed with the ending state of the last vector.

By registering the ending state of the last vector and XORing the state with the desired state of the first bit cell of the current vector, XOR marker definitions representing a resultant waveform 36 can be obtained from output waveform 34, as shown in a table below. The table uses output waveform 34 as its programmed output drive level ($P_i$). Thus $P_i$ is the desired pattern data. The resultant waveform ($R_i$) represents the resultant waveform obtained. In the table shown below, the ending state of the last vector is assumed to be LO.

TABLE 4

| Marker | i = (Vector, Bit) | $R_i = P_i$ XOR $R_{i-1}$ | $P_i$ | $R_i$ |
|---|---|---|---|---|
| T1A-V0 | 0, 0 | $P_{(0,0)}$ XOR LO | HI | HI XOR LO = HI |
| T1B-V0 | 0, 1 | $P_{(0,1)}$ XOR $P_{(0,0)}$ | HI | HI XOR HI = LO |
| T2A-V0 | 0, 2 | $P_{(0,2)}$ XOR $P_{(0,1)}$ | LO | LO XOR LO = LO |
| T2B-V0 | 0, 3 | $P_{(0,3)}$ XOR $P_{(0,2)}$ | HI | HI XOR LO = HI |
| T3A-V0 | 0, 4 | $P_{(0,4)}$ XOR $P_{(0,3)}$ | HI | HI XOR HI = LO |
| T3B-V0 | 0, 5 | $P_{(0,5)}$ XOR $P_{(0,4)}$ | LO | LO XOR LO = LO |
| T4A-V0 | 0, 6 | $P_{(0,6)}$ XOR $P_{(0,5)}$ | LO | LO XOR LO = LO |
| T4B-V0 | 0, 7 | $P_{(0,7)}$ XOR $P_{(0,6)}$ | LO | LO XOR LO = LO |
| T1A-V1 | 1, 0 | $P_{(1,0)}$ XOR LO | HI | HI XOR LO = HI |
| T1B-V1 | 1, 1 | $P_{(1,1)}$ XOR $P_{(1,0)}$ | LO | LO XOR HI = HI |
| T2A-V1 | 1, 2 | $P_{(1,2)}$ XOR $P_{(1,1)}$ | HI | HI XOR HI = LO |
| T2B-V1 | 1, 3 | $P_{(1,3)}$ XOR $P_{(1,2)}$ | LO | LO XOR LO = LO |
| T3A-V1 | 1, 4 | $P_{(1,4)}$ XOR $P_{(1,3)}$ | HI | HI XOR LO = HI |
| T3B-V1 | 1, 5 | $P_{(1,5)}$ XOR $P_{(1,4)}$ | HI | HI XOR HI = LO |
| T4A-V1 | 1, 6 | $P_{(1,6)}$ XOR $P_{(1,5)}$ | LO | LO XOR LO = LO |
| T4B-V1 | 1, 7 | $P_{(1,7)}$ XOR $P_{(1,6)}$ | HI | HI XOR LO = HI |

Figure 5:
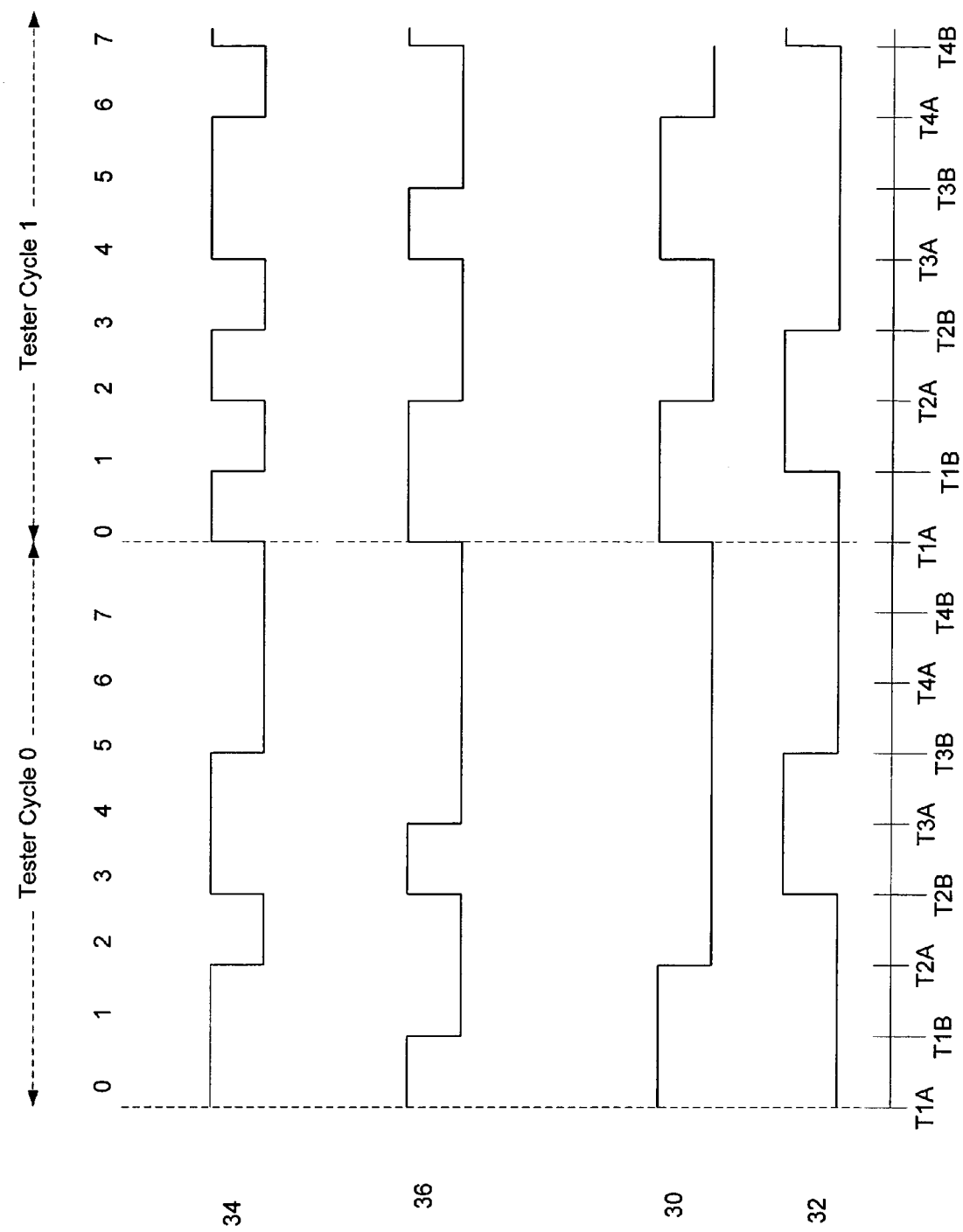
FIG. 5 illustrates a waveform obtained by performing an XOR operation on the ending state of a vector and the desired beginning state of the next vector.

FIG. 5 illustrates the waveform $R_i$ obtained in the table above as waveform 36. Waveform 36 can be obtained by selecting waveform 30 state values during channel 0 events (T1A, T2A, T3A, and T4A) and waveform 32 state values during channel 1 events (T1B, T2B, T3B, and T4B) as shown in the table below, wherein the bold type font in columns 3 and 4 represent the value of Ri for the corresponding bit:

TABLE 5

| Marker | Vector, Bit | $R_i$ 36 | Waveform 30 | Waveform 32 |
|---|---|---|---|---|
| T1A-V0 | 0, 0 | HI | HI | LO |
| T1B-V0 | 0, 1 | LO | HI | LO |
| T2A-V0 | 0, 2 | LO | LO | LO |
| T2B-V0 | 0, 3 | HI | LO | HI |
| T3A-V0 | 0, 4 | LO | LO | HI |
| T3B-V0 | 0, 5 | LO | LO | LO |
| T4A-V0 | 0, 6 | LO | LO | LO |
| T4B-V0 | 0, 7 | LO | LO | LO |
| T1A-V1 | 1, 0 | HI | HI | LO |
| T1B-V1 | 1, 1 | HI | HI | HI |
| T2A-V1 | 1, 2 | LO | LO | HI |
| T2B-V1 | 1, 3 | LO | LO | LO |
| T3A-V1 | 1, 4 | HI | HI | LO |
| T3A-V1 | 1, 4 | LO | HI | LO |
| T4A-V1 | 1, 6 | LO | LO | LO |
| T4B-V1 | 1, 7 | HI | LO | HI |

Therefore, by starting with the desired pattern data 34 and generating the resultant waveform 36, it can be known what the programmed drive waveforms 30 and 32 must be based on the following linear equation system:

(Waveform 30 for bits 0, 2, 4, and 6) and (Waveform 32 for bits 1, 3, 5, and 7)=Waveform 36.

Table 6 below illustrates the linear equations being solved. For bits 0, 2, 4, and 6, waveform 36 state values equal waveform 30 state values, as shown in column 5. For bits 1, 3, 5, and 7, waveform 36 state values equal waveform 32 state values, as shown in column 6.

TABLE 6

| Marker | Vector, Bit | 36 | 30 | 32 |
|---|---|---|---|---|
| T1A-V0 | 0, 0 | HI | HI | |
| T1B-V0 | 0, 1 | LO | HI | LO |
| T2A-V0 | 0, 2 | LO | LO | LO |
| T2B-V0 | 0, 3 | HI | LO | HI |
| T3A-V0 | 0, 4 | LO | LO | HI |
| T3B-V0 | 0, 5 | LO | LO | LO |
| T4A-V0 | 0, 6 | LO | LO | LO |
| T4B-V0 | 0, 7 | LO | LO | LO |

TABLE 6-continued

| Marker | Vector, Bit | 36 | 30 | 32 |
|---|---|---|---|---|
| T1A-V1 | 1, 0 | HI | HI | LO |
| T1B-V1 | 1, 1 | HI | HI | HI |
| T2A-V1 | 1, 2 | LO | LO | HI |
| T2B-V1 | 1, 3 | LO | LO | LO |
| T3A-V1 | 1, 4 | HI | HI | LO |
| T3A-V1 | 1, 5 | LO | HI | LO |
| T4A-V1 | 1, 6 | LO | LO | LO |
| T4B-V1 | 1, 7 | HI | LO | HI |

Table 6 illustrates that at even numbered bits (0, 2, 4 and 6), waveform 30 equals waveform 36. Thus, for vector 0, waveform 30 is HI at bit 0, LO at bit 2, LO at bit 4, and LO at bit 6, because waveform 36 is HI at bit 0, LO at bit 2, LO at bit 4, and LO at bit 6. At bits 1, 3, 5 and 7 of vector 0, waveform 30 retains the state at bit 0, 2, 4, and 6 respectively. For vector 1, waveform 30 is HI at bit 0, LO at bit 2, HI at bit 4, and LO at bit 6, because waveform 36 is HI at bit 0, LO at bit 2, HI at bit 4, and LO at bit 6. At bits 1, 3, 5 and 7 of vector 1, waveform 30 retains the state at bit 0, 2, 4, and 6 respectively.

At odd numbered bits (1, 3, 5 and 7), waveform 32 equals waveform 36. Thus, for vector 0, waveform 32 is LO at bit 1, HI at bit 3, LO at bit 5, and LO at bit 7, because waveform 36 is LO at bit 1, HI at bit 3, LO at bit 5, and LO at bit 7. At bits 2, 4, and 6 of vector 0, waveform 32 retains the state at bits 1, 3 and 5 respectively. For vector 1, waveform 32 is HI at bit 1, LO at bit 3, LO at bit 5, and HI at bit 7, because waveform 36 is HI at bit 1, LO at bit 3, LO at bit 5, and HI at bit 7. At bit 0 of vector 1, waveform 32 retains the state of bit 7 of the last vector. At bits 2, 4 and 6 of vector 1, waveform 32 retains the state at bits 1, 3 and 5 respectively.

Additionally, the values of waveform 34 and waveform 36 can also be used to determine and/or check waveform 30 state values for bits 1, 3, 5, and 7, and waveform 32 state values for bits 0, 2, 4, and 6. Waveform 34 represents an XOR of waveforms 30 and 32. Thus, if waveform 34 is HIGH, the set of solutions for the values of (waveform 30, waveform 32) is limited to (LO, HI) and (HI, LO). And, if waveform 34 is LO, the set of solutions for the values of (waveform 30, waveform 32) is limited to (LO, LO) and (HI, HI).

For instance, for bit 1, waveform 30 can be LO or HI, since waveform 34 is HI; but since waveform 32 is LO, waveform 30 is HI. For bit 3, waveform 30 can be LO or HI, since waveform 34 is HI; but since waveform 32 is HI, waveform 30 is LO. For bit 5, waveform 30 can be LO or HI, since waveform 34 is LO; but since waveform 32 is HI, waveform 30 is HI. The remaining values for waveform 30 can be obtained similarly to obtain the waveform 30 as shown below:

TABLE 7

| Marker | Vector, Bit | 34 | (30,32) | 36 | Solution Set picked | 30 |
|---|---|---|---|---|---|---|
| T1A-V0 | 0, 0 | HI | (LO, HI)/(HI, LO) | HI | | |
| T1B-V0 | 0, 1 | HI | (LO, HI)/(HI, LO) | LO | (HI, LO) | HI |
| T2A-V0 | 0, 2 | LO | (HI, HI)/(LO, LO) | LO | | |
| T2B-V0 | 0, 3 | HI | (LO, HI)/(HI, LO) | HI | (LO, HI) | LO |
| T3A-V0 | 0, 4 | HI | (LO, HI)/(HI, LO) | LO | | |
| T3B-V0 | 0, 5 | LO | (HI, HI)/(LO, LO) | LO | (LO, LO) | LO |
| T4A-V0 | 0, 6 | LO | (HI, HI)/(LO, LO) | LO | | |
| T4B-V0 | 0, 7 | LO | (HI, HI)/(LO, LO) | LO | (LO, LO) | LO |
| T1A-V1 | 1, 0 | HI | (LO, HI)/(HI, LO) | HI | | |
| T1B-V1 | 1, 1 | LO | (HI, HI)/(LO, LO) | HI | (HI, HI) | HI |
| T2A-V1 | 1, 2 | HI | (LO, HI)/(HI, LO) | LO | | |
| T2B-V1 | 1, 3 | LO | (HI, HI)/(LO, LO) | LO | (LO, LO) | LO |
| T3A-V1 | 1, 4 | HI | (LO, HI)/(HI, LO) | HI | | |
| T3A-V1 | 1, 4 | HI | (LO, HI)/(HI, LO) | LO | (HI, LO) | HI |
| T4A-V1 | 1, 6 | LO | (HI, HI)/(LO, LO) | LO | | |
| T4B-V1 | 1, 7 | HI | (LO, HI)/(HI, LO) | HI | (LO, HI) | LO |

Similarly, waveform 32 can be obtained as shown below:

TABLE 8

| Marker | Vector, Bit | 34 | (30,32) | 36 | Solution Set picked | 32 |
|---|---|---|---|---|---|---|
| T1A-V0 | 0, 0 | HI | (LO, HI)/(HI, LO) | HI | (HI, LO) | LO |
| T1B-V0 | 0, 1 | HI | (LO, HI)/(HI, LO) | LO | | |
| T2A-V0 | 0, 2 | LO | (HI, HI)/(LO, LO) | LO | (LO, LO) | LO |
| T2B-V0 | 0, 3 | HI | (LO, HI)/(HI, LO) | HI | | |
| T3A-V0 | 0, 4 | HI | (LO, HI)/(HI, LO) | LO | (LO, HI) | HI |
| T3B-V0 | 0, 5 | LO | (HI, HI)/(LO, LO) | LO | | |
| T4A-V0 | 0, 6 | LO | (HI, HI)/(LO, LO) | LO | (LO, LO) | LO |
| T4B-V0 | 0, 7 | LO | (HI, HI)/(LO, LO) | LO | | |
| T1A-V1 | 1, 0 | HI | (LO, HI)/(HI, LO) | HI | (HI, LO) | LO |
| T1B-V1 | 1, 1 | LO | (HI, HI)/(LO, LO) | HI | | |
| T2A-V1 | 1, 2 | HI | (LO, HI)/(HI, LO) | LO | (LO, HI) | HI |
| T2B-V1 | 1, 3 | LO | (HI, HI)/(LO, LO) | LO | | |
| T3A-V1 | 1, 4 | HI | (LO, HI)/(HI, LO) | HI | (HI, LO) | LO |
| T3A-V1 | 1, 4 | HI | (LO, HI)/(HI, LO) | LO | | |
| T4A-V1 | 1, 6 | LO | (HI, HI)/(LO, LO) | LO | (LO, LO) | LO |
| T4B-V1 | 1, 7 | HI | (LO, HI)/(HI, LO) | HI | | |

Figure 6:
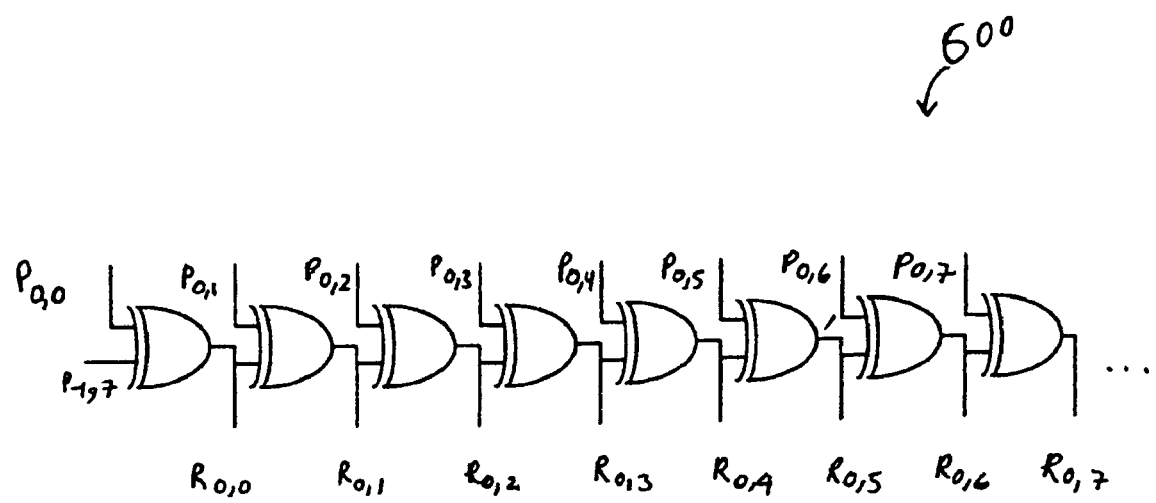
FIG. 6 is a circuit for conversion of drive data to an XOR format.

This method is advantageous in that the desired output data (e.g. waveform 34) can thus be programmed, while the programmed channel data (e.g. waveforms 30 and 32) can be obtained from a resultant waveform (e.g. waveform 36) obtained from the desired output data (e.g. waveform 34). Further, the marker data is only programmed to the level desired for the bit cell of interest. The XOR results are propagated for all selected bits of the vector and the ending state of the current vector is latched and used as the entry level for the next tester vector. FIG. 6 illustrates one embodiment of a circuit 600 that can be used to implement the table above. The circuit 600 registers the ending state of the last vector and XORs that state with the desired state of the first bit cell of the current vector. Thus, circuit 600 performs the task of determining the XOR pattern, such that only the desired pattern data needs to be implemented as software.

The present invention also relates to apparatus for performing the operations herein. This apparatus may be specially constructed for the required purposes, or it may comprise an electronic tester selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

In the forgoing specification, the invention has been described with reference to specific exemplary embodiments. It will, however, be evident that various modifications and changes may be made thereto without departing from the broader spirit and scope of the invention. The specification and drawings are accordingly to be regarded in an illustrative sense rather than a restrictive sense.

What is claimed is:

1. A method comprising:
   dividing a first test pattern data into a plurality of groups, the plurality of groups comprising at least a first group and a second group, an electronic tester to successively execute the first group and the second group and to generate programmed transition commands;
   providing an assumed entry state for each group as one of two binary conditions; and
   inverting programmed transition commands associated with the second group if the ending state of the first group is not equal to the assumed entry state for the second group.

2. The method recited in claim 1, further comprising:
   executing the transition commands associated with the second group as programmed if the ending state of the first group is equal to the assumed entry state for the second group.

3. The method recited in claim 1, wherein the entry state for each group is one of Logic ZERO or Logic ONE.

4. The method recited in claim 1, wherein the ending state of the first group is not equal to the assumed entry state for the first group due to a change to the test pattern data in the first group.

5. The method recited in claim 4, wherein the change to the test pattern data changes the ending state of the first group.

6. The method recited in claim 5, wherein the change to the test pattern data does not change the entry state of the second group.

7. The method recited in claim 1, wherein the programmed commands for the first group are independent of the programmed commands for the second group.

8. The method recited in claim 1, wherein the first group and the second group are equal in length.

9. The method recited in claim 1, further comprising:
   concatenating, by the electronic tester, a second test pattern data having an entry state different from the ending state of the second group of the first test pattern data to the first test pattern data.

10. The method recited in claim 1, wherein the method facilitates use of the first test pattern data utilizing XOR data formatting in the electronic tester.

11. A machine-readable medium having executable instructions to cause a processor to perform a method, the method comprising:
    dividing a first test pattern data into a plurality of groups, the plurality of groups comprising at least a first group and a second group, an electronic tester to successively execute the first group and the second group and to generate programmed transition commands;
    providing an assumed entry state for each group as one of two binary conditions; and
    inverting programmed transition commands associated with the second group if the ending state of the first group is not equal to the assumed entry state for the second group.

* * * * *